United States Patent
Cho et al.

(10) Patent No.: US 11,251,258 B2
(45) Date of Patent: Feb. 15, 2022

(54) DISPLAY APPARATUS

(71) Applicant: Samsung Display Co., Ltd., Yongin-si (KR)

(72) Inventors: Seunghwan Cho, Yongin-si (KR);
Jonghyun Choi, Yongin-si (KR);
Kyunghoon Kim, Yongin-si (KR);
Donghwan Shim, Yongin-si (KR);
Seonyoung Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 260 days.

(21) Appl. No.: 16/118,776

(22) Filed: Aug. 31, 2018

(65) Prior Publication Data

US 2019/0088733 A1    Mar. 21, 2019

(30) Foreign Application Priority Data

Sep. 19, 2017   (KR) .................. 10-2017-0120517

(51) Int. Cl.
*H01L 27/32* (2006.01)
*H01L 51/52* (2006.01)
(Continued)

(52) U.S. Cl.
CPC ....... *H01L 27/3279* (2013.01); *G09G 3/3225* (2013.01); *H01L 27/3276* (2013.01);
(Continued)

(58) Field of Classification Search
CPC ............. H01L 27/3279; H01L 27/3276; H01L 27/1214; H01L 27/124; G09G 3/3225
See application file for complete search history.

(56) References Cited

U.S. PATENT DOCUMENTS 6,066,916 A * 5/2000 Osada ................. H01L 27/3276
313/505
8,736,162 B2  5/2014 Jin et al.
(Continued)

FOREIGN PATENT DOCUMENTS

DE  10 2012 211 232 A1   1/2013
JP       05226076 A      9/1993
(Continued)

OTHER PUBLICATIONS

Extended European Search Report for European Patent Application No. 18194792.0 dated Jan. 31, 2019.

*Primary Examiner* — Errol V Fernandes
*Assistant Examiner* — Jeremy J Joy
(74) *Attorney, Agent, or Firm* — Cantor Colburn LLP

(57) ABSTRACT

A display apparatus includes a substrate including a display area including a main display area and an edge display area extended directly from a side of the main display area, and a peripheral area outside the display area and including a pad area through which electrical signals are applied to the display area; and in the peripheral area, a plurality of wirings between the display area and the pad area and through which the electrical signals are transmitted from the pad area to the display area, the plurality of wirings including: a first wiring through which an electrical signal is transmitted from the pad area to the main display area, and a second wiring through which an electrical signal is transmitted from the pad area to the edge display area, where an electrical resistance per unit length of the first wiring is greater than that of the second wiring.

20 Claims, 7 Drawing Sheets

(51) Int. Cl.
*G09G 3/3225* (2016.01)
*H01L 51/50* (2006.01)
*H01L 51/00* (2006.01)

(52) U.S. Cl.
CPC ...... H01L 51/5203 (2013.01); H01L 51/5253 (2013.01); *H01L 51/0097* (2013.01); *H01L 51/5056* (2013.01); *H01L 51/5072* (2013.01); *H01L 51/5092* (2013.01)

(56) References Cited

U.S. PATENT DOCUMENTS

| | | | |
|---|---|---|---|
| 9,287,329 B1 | 3/2016 | Lee et al. | |
| 2009/0242907 A1* | 10/2009 | Hosoya | H01L 21/84 257/88 |
| 2009/0284147 A1* | 11/2009 | Yamashita | H01L 27/3276 313/505 |
| 2012/0218219 A1 | 8/2012 | Rappoport et al. | |
| 2013/0044044 A1* | 2/2013 | Ha | G02F 1/136286 345/55 |
| 2014/0118321 A1* | 5/2014 | Kim | G09G 3/22 345/212 |
| 2015/0015553 A1* | 1/2015 | Cho | G09G 3/3611 345/208 |
| 2015/0187803 A1* | 7/2015 | Moh | G02F 1/13452 257/43 |
| 2016/0181349 A1* | 6/2016 | Cho | H01L 27/3279 257/40 |
| 2016/0343777 A1* | 11/2016 | Hirakata | H01L 27/3262 |
| 2016/0365406 A1* | 12/2016 | Adachi | H01L 51/5284 |
| 2017/0033312 A1* | 2/2017 | Kim | H01L 27/3276 |
| 2017/0162637 A1* | 6/2017 | Choi | G09G 3/20 |
| 2017/0170253 A1 | 6/2017 | Kim et al. | |
| 2017/0188463 A1 | 6/2017 | Kim et al. | |
| 2017/0206835 A1 | 7/2017 | Hirakata et al. | |
| 2017/0288008 A1* | 10/2017 | Kim | H01L 51/0097 |
| 2017/0323936 A1* | 11/2017 | Lee | H01L 27/3262 |
| 2018/0083072 A1* | 3/2018 | Kwon | H01L 27/3262 |
| 2018/0130856 A1* | 5/2018 | Kim | H01L 27/3218 |
| 2018/0204895 A1* | 7/2018 | Lin | H01L 27/3276 |
| 2018/0366494 A1* | 12/2018 | Lee | H01L 27/3276 |

FOREIGN PATENT DOCUMENTS

| | | |
|---|---|---|
| JP | 2016197261 A | 11/2016 |
| KR | 1020130020068 A1 | 2/2013 |
| KR | 1020140056421 A | 5/2014 |
| WO | 2017127563 A1 | 7/2017 |

\* cited by examiner

DISPLAY APPARATUS

This application claims priority to Korean Patent Application No. 10-2017-0120517, filed on Sep. 19, 2017, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

As display devices for visually representing various electrical signal information have been rapidly developed, various flat panel display apparatuses having excellent characteristics such as slimness, light weight, and low power consumption have been introduced on the market. Also, by removing physical buttons, etc. from front surfaces of display apparatuses, display apparatuses with increased display areas have recently been manufactured.

SUMMARY

One or more embodiments include a display apparatus with a reduced luminance difference between a central portion and an edge portion of the display apparatus.

According to one or more embodiments, a display apparatus includes: a substrate including a display area in which an image is displayed with light, the display area including a main display area and an edge display area which is extended directly from a side of the main display area, and a peripheral area which is outside the display area and in which the image is not displayed, the peripheral area including a pad area through which electrical signals are applied to the display area; and in the peripheral area, a plurality of wirings between the display area and the pad area and through which the electrical signals are transmitted from the pad area to the display area, the plurality of wirings including: a first wiring through which an electrical signal is transmitted from the pad area to the main display area, and a second wiring through which an electrical signal is transmitted from the pad area to the edge display area, where an electrical resistance per unit length of the first wiring is greater than an electrical resistance per unit length of the second wiring.

The display apparatus may further include a thin-film transistor ("TFT") in the display area and including a gate electrode, a source electrode, and a drain electrode, and a first interlayer insulating film respectively between the gate electrode and each of the source and drain electrodes, where the second wiring in the peripheral area includes a same material as the source electrode and the drain electrode in the display area, and the first wiring in the peripheral area includes a same material as the gate electrode in the display area.

The second wirings, the source electrode and the drain electrode may be in a same layer as each other among layers disposed on the substrate.

The display apparatus may further include: a second interlayer insulating layer covering the source electrode and the drain electrode in the display area; and an intermediate conductive layer connected to the source electrode or the drain electrode, the intermediate conductive layer disposing the second interlayer insulating layer between the intermediate conductive layer and the respective source electrode or drain electrode connected thereto.

In the peripheral area, the second wiring is provided in plural between the display area and the pad area to be adjacent to each other in a top plan view, one of two adjacent second wirings in the peripheral area may be in a same layer as the source electrode and the drain electrode of the display area among layers disposed on the substrate, and the remaining one of the two adjacent second wirings in the peripheral area may be in a same layer as the intermediate conductive layer in the display layer among the layers on the substrate.

Adjacent side surfaces of the two adjacent second wirings in the peripheral area may be vertically aligned with each other.

The display area may further include a side display area disposed in a plane perpendicular to a plane in which the main display area is disposed, and the side display area may be extended directly from the edge display area or extended directly from the main display area.

The side display area may be extended directly from the edge display area, the plurality of wirings further include a third wiring through which an electrical signal is transmitted from the pad area to the side display area, and an electrical resistance per unit length of the third wiring is less than the electrical resistance per unit length of the first wiring.

The display apparatus may further include: a thin-film transistor ("TFT") in the display area; a display device electrically connected to the TFT and with which the light is emitted to display the image; and an encapsulation layer which seals the display device on the substrate, where the encapsulation layer includes a first inorganic encapsulation layer, an organic encapsulation layer, and a second inorganic encapsulation layer sequentially stacked, and in the peripheral area, the second wiring is on the second inorganic encapsulation layer.

The substrate may include a first substrate layer, a second substrate layer, and an inorganic layer between the first substrate layer and the second substrate layer, the second wiring is between the first substrate layer and the inorganic layer, between the inorganic layer and the second substrate layer, or both between the first substrate layer and the inorganic layer and between the inorganic layer and the second substrate layer.

According to one or more embodiments, a display apparatus includes: a substrate including a display area in which an image is displayed with light, the display area including: a main display area, an edge display area which is extended directly from each of opposing sides of the main display area, the edge display area being convexly curved relative to the main display area, and a side display area disposed in a plane perpendicular to a plane in which the main display area is disposed, and a peripheral area outside the display area and in which the image is not displayed, the peripheral area including: a pad area through which electrical signals are applied to the display area; and in the peripheral area, a plurality of wirings between the display area and the pad area and through which the electrical signals are transmitted from the pad area to the display area, the plurality of wirings including: a first wiring through which an electrical signal is transmitted from the pad area to the main display area, second wirings through which an electrical signal is respectively transmitted from the pad area to each of the edge display areas, and a third wiring through which an electrical signal is transmitted from the pad area to the side display area, where an electrical resistance per unit length of each of the second wirings and an electrical resistance per unit length of the third wiring are less than an electrical resistance per unit length of the first wiring.

The side display area may be extended directly from one of the edge display areas.

The side display area may be provided in plurality including: a first side display area extended directly from one of the edge display areas, and a second side display area extended directly from the main display area, where the first wiring may transmit the electrical signal to the main display area through the second side display area extended directly from the main display area.

The display apparatus may further include: a thin-film transistor ("TFT") in the display area and including a gate electrode, and a source electrode and a drain electrode; a first interlayer insulating film respectively between the gate electrode and each of the source and drain electrodes; a second interlayer insulating layer covering the source electrode and the drain electrode; and an intermediate conductive layer located connected to the source electrode or the drain electrode, the intermediate conductive layer disposing the second interlayer insulating layer between the intermediate conductive layer and the respective source electrode or drain electrode connected thereto, where the second wirings and the third wiring in the peripheral area comprise a same material as the intermediate conductive layer or the source electrode and the drain electrode in the display area.

Any one of two adjacent wirings from among the second wirings in the peripheral area may be in a same layer as the source electrode and the drain electrode in the display area among layers disposed on the substrate, and the remaining one of the two adjacent wirings in the peripheral area may be in a same layer as the intermediate conductive layer in the display area among the layers disposed on the substrate.

Any one of two adjacent third wirings in the peripheral area may be in a same layer as the source electrode and the drain electrode in the display area among the layers disposed on the substrate, and the remaining one of the two adjacent third wirings in the peripheral area may be in a same layer as the intermediate conductive layer in the display area among the layers disposed on the substrate.

In the peripheral area, the third wiring may be provided in plural between the display area and the pad area to be adjacent to each other in a top plan view, one of two adjacent third wirings in the peripheral area may be in a same layer as the source electrode and the drain electrode in the display area among layers disposed on the substrate, and the remaining one of the two adjacent third wirings in the peripheral area may be in a same layer as the intermediate conductive layer in the display area among the layers disposed on the substrate.

The substrate may include a first substrate layer, a second substrate layer, and an inorganic layer between the first substrate layer and the second substrate layer, where the second wirings and the third wiring are between the first substrate layer and the inorganic layer, between the inorganic layer and the second substrate layer, or both between the first substrate layer and the inorganic layer and between the inorganic layer and the second substrate layer.

The display apparatus may further include: a thin-film transistor ("TFT") in the display area; a display device electrically connected to the TFT and with which the light is emitted to display the image; and an encapsulation layer which seals the display device on the substrate, where the encapsulation layer includes a first inorganic encapsulation layer, an organic encapsulation layer, and a second inorganic encapsulation layer sequentially stacked, and the second wirings and the third wiring are on the second inorganic encapsulation layer.

The display apparatus may further include in the peripheral area, a protective film covering the second wirings and the third wiring which are on the second inorganic encapsulation layer.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
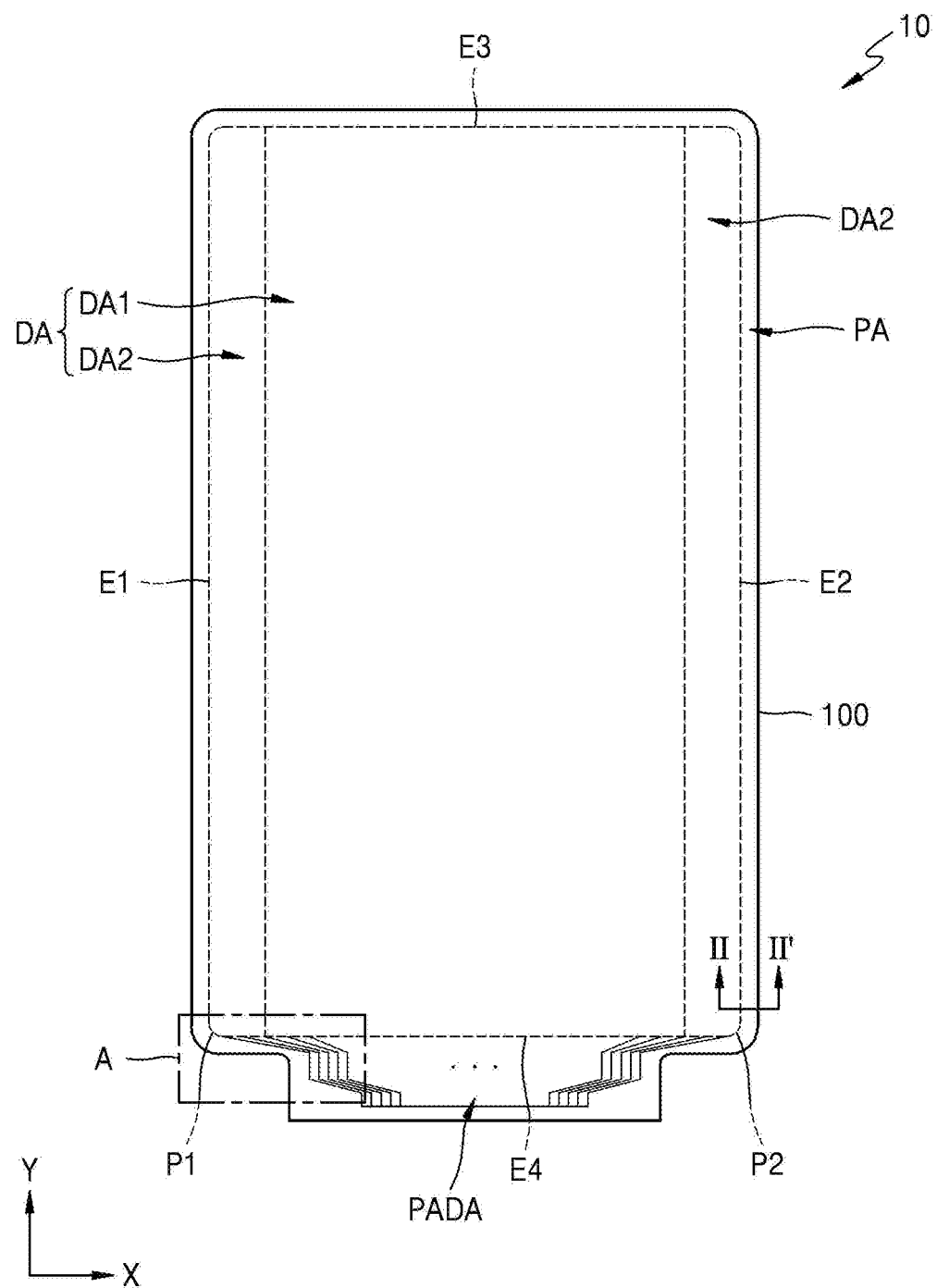
FIG. 1 is a top plan view of an embodiment of a display apparatus according to the invention.

The present disclosure may include various embodiments and modifications, and embodiments thereof will be illustrated in the drawings and will be described herein in detail. The effects and features of the present disclosure and the accompanying methods thereof will become apparent from the following description of the embodiments, taken in conjunction with the accompanying drawings. However, the present disclosure is not limited to the embodiments described below, and may be embodied in various modes.

It will be understood that although the terms "first," "second," etc. may be used herein to describe various elements, these elements should not be limited by these terms. These elements are only used to distinguish one element from another.

The terminology used herein is for the purpose of describing particular embodiments only and is not intended to be limiting. As used herein, the singular forms "a," "an," and "the" are intended to include the plural forms as well, unless the context clearly indicates otherwise. "At least one" is not to be construed as limiting "a" or "an." "Or" means "and/or."

As used herein, the term "and/or" includes any and all combinations of one or more of the associated listed items.

It will be further understood that the terms "comprises" and/or "comprising" used herein specify the presence of stated features or components, but do not preclude the presence or addition of one or more other features or components.

It will be understood that when a layer, region, or element is referred to as being related to another element such as being "on" or "formed on" another layer, region, or element, it may be directly or indirectly formed on the other layer, region, or element. That is, for example, intervening layers, regions, or elements may be present. In contrast, when a layer, region, or element is referred to as being related to another element such as being "directly on" or "formed directly on" another layer, region, or element, no intervening layers, regions, or elements are present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Sizes of elements may be exaggerated for convenience of explanation. In other words, since sizes and thicknesses of elements in the drawings are arbitrarily illustrated for convenience of explanation, the following embodiments are not limited thereto.

When a certain embodiment may be implemented differently, a specific process order may be different from the described order. For example, two consecutively described processes may be performed substantially at the same time or performed in an order opposite to the described order.

The present disclosure will now be described more fully with reference to the accompanying drawings, in which embodiments are shown. The same or corresponding reference numerals in the drawings denote the same elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As a display area in a display apparatus is increased, wirings for applying signals to pixels located in the display area have different lengths, which cause an electrical resistance difference between the wirings and a luminance difference between the pixels.

Figure 2:
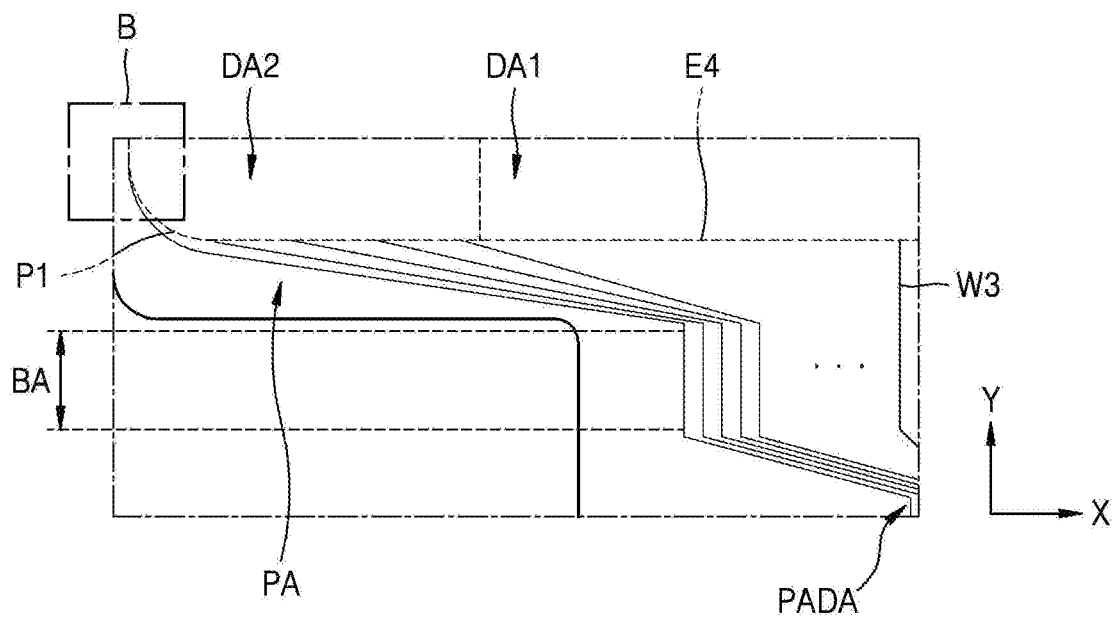
FIG. 2 is an enlarged top plan view illustrating portion A of FIG. 1.
Figure 3:
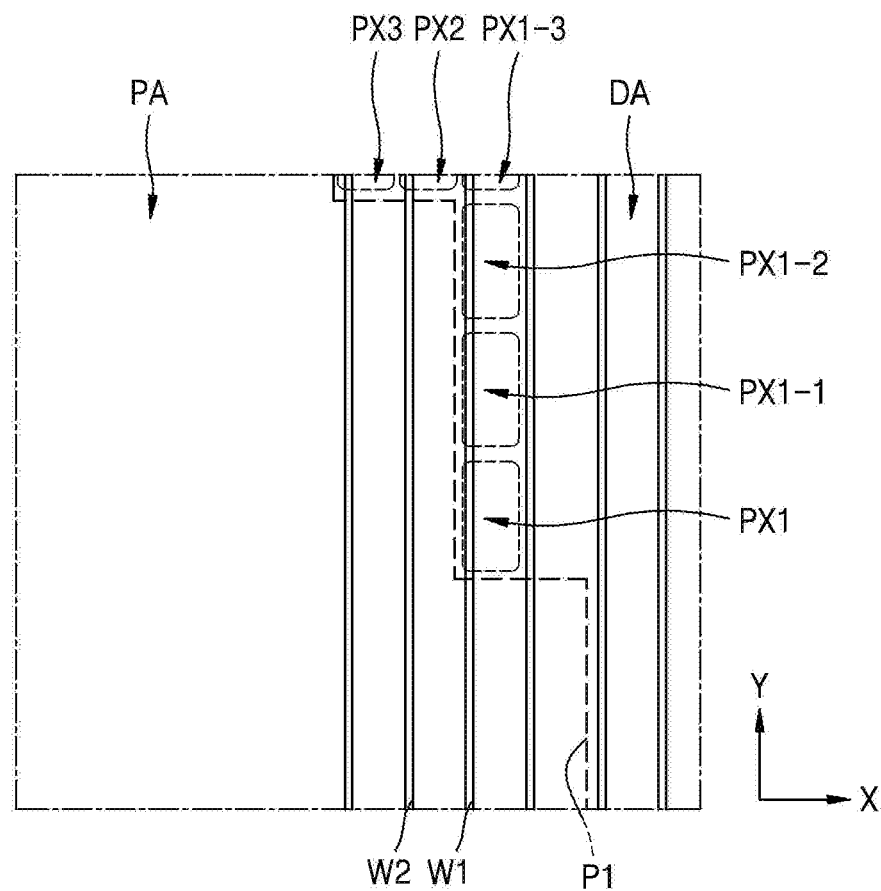
FIG. 3 is an enlarged top plan view illustrating portion B of FIG. 2.
Figure 4:
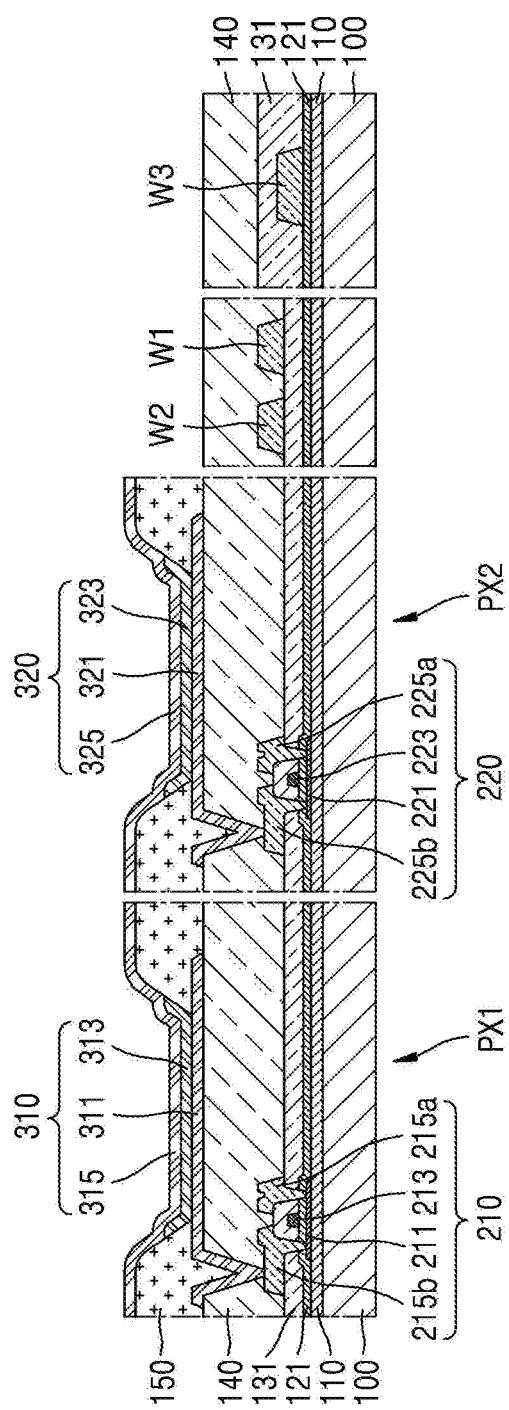
FIG. 4 is a cross-sectional view illustrating embodiments of portions of FIGS. 2 and 3 according to the invention.

FIG. 1 is a top plan view of an embodiment of a display apparatus 10 according to the invention. FIG. 2 is an enlarged top plan view illustrating portion A of FIG. 1. FIG. 3 is an enlarged top plan view illustrating portion B of FIG. 2. FIG. 4 is a cross-sectional view illustrating an embodiment of portions of FIGS. 2 and 3 according to the invention. The display apparatus 10 and components thereof are disposed in a plane parallel to a plane defined by a first direction (e.g., an X-axis direction) and a second direction (e.g., a Y-axis direction) which crosses the first direction. A thickness of the display apparatus 10 and components thereof is defined in a third direction crossing each of the first and second directions.

As shown in FIG. 1, the display apparatus 10 according to the present embodiment includes a substrate 100 including a display area DA at which an image is displayed with light and a peripheral area PA at which no image is displayed. A pixel at which the image is generated and/or displayed or at which light is emitted to display an image may be provided in plurality located in the display area DA. The peripheral area PA is located around the display area DA and includes a pad area PADA at which an electronic signal (e.g., a control or driving signal) is input from outside the display apparatus 10. Various electronic devices, a printed circuit board, etc. are electrically mounted in the pad area PADA. The various electronic devices in the pad area PADA may be connected to the pixels in the display area DA, such that the electronic signal is applied to the pixels from the pad area PADA. Conductive wirings or lines such as various signal lines may connect elements of the pixels in the display area DA and the various electronic devices in the pad area PADA to each other.

FIG. 1 may be also understood as being a top plan view illustrating the substrate 100, etc. during an embodiment of a process of manufacturing the display apparatus 10 according to the invention. In the final display apparatus 10 or an electronic apparatus such as a smartphone including the display apparatus 10, parts of the display area DA and the substrate 100 may be bent in order to minimize the area of the peripheral area PA recognized by a user.

In an embodiment, for example, as shown in FIG. 1, the display area DA may include a main display area DA1 and an edge display area DA2 which is located at a side of the main display area DA1. In an embodiment, for example, two edge display areas DA2 may be respectively located at opposing sides of the main display area DA1 along the X-axis direction. In an initial state of the display apparatus 10, the main display area DA1 and the edge display area DA2 are each disposed in a single plane which is parallel to a plane defined in the first (X-axis) and second (Y-axis) directions.

In the final display apparatus 10 or an electronic apparatus such as a smartphone including the display apparatus 10, the substrate 100 and layers thereon may be bent at the edge display areas DA2 to have an outward convex shape. That is, the edge display areas DA2 of the bent display apparatus 10 are disposed in a plane different from that of the main display area DA1. Accordingly, in a front view of the display apparatus 10, both of the opposing edge portions of the display apparatus 10 arranged along the X-axis direction may occupy a minimal planar area in the plane defined by the X-axis and Y-axis directions such that the bent display apparatus 10 includes essentially no bezel and thus the display area DA may be expanded and maximized.

Also, as shown in FIG. 2, the peripheral area PA may include a bending area BA at which components of the display apparatus 10 such as the substrate 100 and layers thereon are bendable. In the top plan view, the bending area BA may be located between the pad area PADA and the display area DA. In this case, the substrate 100 and layers thereon may be bent from an un-bent state of the display apparatus 10, at the bending area BA, so that at least a part of the pad area PADA is disposed to overlap the display area DA. A bending direction is set so that the pad area PADA is located behind the display area DA (e.g., at a back side opposite to that side at which the image is displayed or viewable), instead of covering the display area DA at the front side of the display apparatus 10. Accordingly, the user recognizes that the display area DA occupies a relatively large part of the display apparatus 10.

The substrate 100 may be a base substrate of the display apparatus 10, where the substrate 100 and the layers thereon form a collective "display substrate." The substrate 100 may include any of various flexible or bendable materials. In an embodiment, for example, the substrate 100 may include a polymer resin such as polyethersulfone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC") or cellulose acetate propionate ("CAP"). Various modifications may be made, and, for example, the substrate 100 may have a multi-layer structure including two layers each including a polymer resin and a barrier layer located between the two layers and including an inorganic material such as silicon oxide, silicon nitride or silicon oxynitride.

An edge of the display area DA as a boundary thereof with the peripheral area may form a rectangular shape, a square shape or the like. However, as shown in FIGS. 1 and 2, a first portion P1 of the edge of the display area DA has a non-linear shape such as a curved or rounded shape. In detail, the display area DA may include a first edge E1 and a second edge E2 facing each other, and a third edge E3 and a fourth edge E4 facing each other and located between the first edge E1 and the second edge E2. The pad area PADA is adjacent to the fourth edge E4 from among the first edge E1 through the fourth edge E4. In this case, the first portion P1 having a round shape connects the first edge E1 and the fourth edge E4 to each other. A second portion P2 of the edge of the display area DA as well as the first portion P1 may have a round shape. The second portion P2 connects the second edge E2 and the fourth edge E4 to each other. Also, the display area DA may have a round shape at other portions in addition to the first and second portions P1 and P2.

FIG. 3 is an enlarged top plan view illustrating the portion B of FIG. 2, especially illustrating a part of the first portion P1. As shown in FIGS. 1 and 2, when the user using the display apparatus 10 of the present embodiment or an electronic apparatus including the display apparatus 10 observes in a typical use environment (e.g., not enlarged or magnified view), the first portion P1 is recognized by the user as having an overall round shape, that is, a curved shape. However, in an environment in which the first portion P1 is enlarged and wirings each having a width of several to tens of micrometers may be observed in such enlarged view, the first portion P1 may have a collective shape with linear portions forming multiple bends as shown in FIG. 3.

Although the first portion P1 has an overall linear shape with multiple bends as shown in FIG. 3 as an enlarged view of the first portion P1, since the first portion P1 is recognized as having a round shape, that is, a curved shape, in a typical use environment, the following will be described on the assumption that the first portion P1 has a round shape. A plurality of pixels PX1, PX1-1, PX1-2, PX2 and PX3 among the pixels of the display area DA may be located in the display area DA and arranged along the first portion P1 having a round shape. For convenience of explanation, only a portion of a plurality of pixels in the display area DA is illustrated in FIG. 3.

Various electrical signals may be applied to the display area DA. In an embodiment, for example, a data signal for adjusting brightness in each pixel may be applied to the display area DA, such as to the pixel therein. To this end, various wirings such as data wirings may be located inside and outside the display area DA, such as a data wiring disposed in the display area DA extending outside thereof to be disposed in the peripheral area PA. In an embodiment, for example, most of the data wirings are located in the display area DA such that most of the length of each data wiring is located in the display area DA. However, since (terminal) ends of the data wirings are located in the peripheral area PA and are electrically connected to second wirings W1 and W2 and a first wiring W3, the data wirings are not just located in the display area DA. That is, it may be understood as meaning that (terminal) ends of the data wirings are electrically connected to the second wirings W1 and W2 and the first wiring W3 at the peripheral area PA and the data wirings extend from the peripheral area PA into the display area DA. The second wirings W1 and W2 in FIG. 3 may be represented by the inclined lines extended from the display area DA in FIG. 2. The second wirings W1 and W2 and/or the first wiring W3 may be provided in plural within the display apparatus 10.

The display apparatus 10 may include the second wirings W1 and W2 and the first wiring W3 with which an electrical signal is applied to the display area DA from outside thereof. The second wirings W1 and W2 and the first wiring W3 may be located between the pad area PADA and the display area DA. The wirings may include the first wiring W3 through which a data signal is applied to the main display area DA1 from outside thereof and the second wirings W1 and W2 through which a data signal is applied to the edge display areas DA2. For convenience of explanation, the following will be described on the assumption that the second wirings W1 and W2 for applying a data signal to the edge display areas DA2 are referred to as 2-1 wiring W1 and 2-2 wiring W2, and the wiring W3 for applying a data signal to the main display area DA1 is the first wiring W3.

The 2-1 wiring W1 may transmit an electrical signal such as a data signal to the pixels PX1, PX1-1, PX1-2 and PX1-3 disposed in one column along a single virtual line located in the edge display area DA2. The 2-2 wiring W2 may transmit an electrical signal such as a data signal to the pixel PX2 in another column located along a different single virtual line in the edge display area DA2. The 2-1 wiring W1 and the 2-2 wiring W2 may be relatively long wirings whose terminal ends are located in the pad area PADA, and may each have a shape with multiple bends. In contrast, the first wiring W3 may have a length less than that of each of the 2-1 wiring W1 and the 2-2 wiring W2.

In a conventional display apparatus, when the 2-1 wiring W1, the 2-2 wiring W2 and the first wiring W3 are formed of the same material, an electrical resistance of the first wiring W3 is less than that of each of the 2-1 wiring W1 and the 2-2 wiring W2, and a luminance of each of the edge display areas DA2 may be less than a luminance of the main display area DA1 by the electronic signals respectively applied thereto through the various wirings. However, according to one or more embodiment of the present disclosure, the 2-1 wiring W1 and the 2-2 wiring W2 are each formed of a material having an electrical resistance less than that of the first wiring W3. Therefore, even when the 2-1 wiring W1 and the 2-2 wiring W2 have overall greater great lengths than that of the first wiring W3, an electrical resistance difference of the 2-1 wiring W1 and the 2-2 wiring W2 from the first wiring W3 may be reduced such that a difference in luminance of the various display area is reduced.

An embodiment will now be explained in more detail with reference to FIG. 4 that is a cross-sectional view illustrating portions of FIGS. 2 and 3. FIG. 4 is a cross-sectional view illustrating portions that are spaced apart from each other in FIGS. 2 and 3, even though the portions are shown adjacent to each other within the views of FIG. 4. Although the pixel PX1 and the pixel PX2 are illustrated adjacent to each other in FIG. 4 for convenience of description, the pixel PX1 and the pixel PX2 are not pixels that are located adjacent to each other as shown in FIG. 3.

Also, FIG. 4 shows adjacent cross-sectional views of the 2-1 wiring W1 and the 2-2 wiring W2 taken along a Y-axis of FIG. 3, and the first wiring W3 taken along a Y-axis of FIG. 2 for convenience of description. The cross-sectional views of the wirings in FIG. 4 are taken in a plane perpendicular to the length of the respective wiring. The length may represent a largest dimension of the wiring in the top plan view. For example, at a portion of the wiring where the length thereof is extended in the Y-axis direction, the width of such wiring is taken perpendicular to the length direction (e.g., the X-axis direction) while a thickness of such wiring is taken in the third (thickness) direction described above.

As shown in FIG. 4, first and second display devices 310 and 320 and first and second switching elements such as thin-film transistors ("TFTs") 210 and 220 to which the first and second display devices 310 and 320 are respectively electrically connected may be located in the display area DA of the substrate 100. In FIG. 4, organic light-emitting devices are the first and second display devices 310 and 320 in the display area DA, but the invention is not limited thereto. When the organic light-emitting devices are electrically connected to the first and second TFTs 210 and 220, it may mean that pixel electrodes 311 and 321 thereof are respectively electrically connected to the first and second TFTs 210 and 220.

For reference, in FIG. 4, the first TFT 210 is located in the pixel PX1, the second TFT 220 is located in the pixel PX2, the first display device 310 is electrically connected to the first TFT 210, and the second display device 320 is electrically connected to the second TFT 220. For convenience of explanation, the first TFT 210 and the first display device 310 will be explained, and the description thereof may apply to the second TFT 220 and the second display device 320. That is, the description of a second semiconductor layer 221, a second gate electrode 223, a second source electrode 225a and a second drain electrode 225b of the second TFT 220, and the description of the pixel electrode 321, a counter electrode 325 and an intermediate layer 323 of the second display device 320 will be omitted. For reference, the counter electrode 325 of the second display device 320 may be integrally formed with a counter electrode 315 of the first display device 310, such that a single counter electrode is common to each of the pixels PX1 and PX2 and the display devices thereof.

The first TFT 210 may include a first semiconductor layer 211 including amorphous silicon, polycrystalline silicon or an organic semiconductor material, a first gate electrode 213, a first source electrode 215a and a first drain electrode 215b. In order to ensure insulation between the first semiconductor layer 211 and the first gate electrode 213, a first gate insulating film 121 including an inorganic material such as silicon oxide, silicon nitride and/or silicon oxynitride may be located between the first semiconductor layer 211 and the first gate electrode 213. In addition, a first interlayer insulating layer 131 including an inorganic material such as silicon oxide, silicon nitride and/or silicon oxynitride may be located on the first gate electrode 213, and the first source electrode 215a and the first drain electrode 215b may be located on the first interlayer insulating film 131.

A buffer layer 110 including an inorganic material such as silicon oxide, silicon nitride and/or silicon oxynitride may be located between the first TFT 210 and the substrate 100. The buffer layer 110 may planarize a top surface of the substrate 100 or may effectively prevent or minimize penetration of impurities from the substrate 100 or the like into the first semiconductor layer 211 of the first TFT 210.

A planarization layer 140 may be located on the first TFT 210. In an embodiment, for example, when an organic light-emitting device as a display device is located on the first TFT 210 as shown in FIG. 4, the planarization layer 140 may substantially planarize and serve as a protective film covering the first TFT 210. The planarization layer 140 may include an organic material such as acryl, benzocyclobutene ("BCB") or hexamethyldisiloxane ("HMDSO"). Although the planarization layer 140 has a single-layer structure in FIG. 4, various modifications may be made, and, for example, the planarization layer 140 may have a multi-layer structure.

The first display device 310 may be located on the planarization layer 140, in the display area DA of the substrate 100. The first display device 310 may be, for example, an organic light-emitting device including the pixel electrode 311, the counter electrode 315, and an intermediate layer 313 located between the pixel electrode 311 and the counter electrode 315. The intermediate layer 313 may include an emission layer with which light is generated and emitted by the first display device 310 at the pixel PX1. The pixel electrode 311 contacts any one from among the first source electrode 215a and the first drain electrode 215b at an opening portion defined or formed in the planarization layer 140 and is electrically connected to the first TFT 210 at such opening portion.

A pixel-defining film 150 may be located on the planarization layer 140. The pixel-defining film 150 defines a pixel by having an opening corresponding to a sub-pixel, that is, an opening through which at least a central portion of the pixel electrode 311 is exposed and at which light is emitted from the pixel. Also, as shown in FIG. 4, the pixel-defining film 150 effectively prevents an electrical arc or the like from occurring at an edge of the pixel electrode 311 by increasing a distance between the edge of the pixel electrode 311 and the counter electrode 315 which is located over the pixel electrode 311. The pixel-defining film 150 may include or be formed of an organic material such as polyimide or HMDSO.

The intermediate layer 313 of the organic light-emitting device may include a relatively low-molecular weight material or a relatively high-molecular weight material. When the intermediate layer 313 includes a relatively low-molecular weight material, the intermediate layer 313 may have a single-layer structure or a multi-layer structure in which a hole injection layer ("HIL"), a hole transport layer ("HTL"), an emission layer ("EML"), an electron transport layer ("ETL") and an electron injection layer ("EIL") are stacked. In an embodiment of a method of manufacturing a display apparatus, the intermediate layer 313 may be formed by using vacuum deposition.

When the intermediate layer 313 includes a relatively high-molecular weight material, the intermediate layer 313 may have a structure including an HTL and an EML. In this case, the HTL may include poly(3,4-ethylenedioxythiophene) ("PEDOT"), and the EML may include a relatively high-molecular weight material such as polyphenylene vinylene ("PPV") or polyfluorene-based relatively high-molecular weight material. In an embodiment of a method of manufacturing a display apparatus, the intermediate layer 313 may be formed by using screen printing, inkjet printing, or laser-induced thermal imaging ("LITI").

However, the intermediate layer 313 is not limited to the above materials, processes or configurations, and may have any of various other structures. The intermediate layer 313 may include a layer that is integrally formed to be commonly disposed with each of the plurality of pixel electrodes 311 and 321, or may include a layer that is patterned from a same material layer to respectively correspond to each of the plurality of pixel electrodes 311 and 321.

The counter electrode 315 may be located over the display area DA to cover the display area DA. That is, the counter electrode 315 may be integrally formed to be commonly disposed for a plurality of organic light-emitting devices and may correspond to each of the plurality of pixel electrodes 311 and 321 of such organic light-emitting devices.

The 2-1 wiring W1 and the 2-2 wiring W2 may include the same material as that of the first source electrode 215a and the first drain electrode 215b. In an embodiment, for example, the 2-1 wiring W1 and the 2-2 wiring W2 may have a three-layer structure formed of titanium/aluminum/titanium. In an embodiment of a method of manufacturing a display apparatus, the 2-1 wiring W1 and the 2-2 wiring W2 may be formed at a time and/or from a same material layer when the first source electrode 215a and the first drain electrode 215b are formed, and may each be located on the first interlayer insulating film 131. However, embodiments are not limited thereto, and positions of the 2-1 wiring W1 and the 2-2 wiring W2 among layers disposed on the substrate 100 may be set in various ways. As one element includes the same material as another element or is located in a same layer as another element, the elements may be formed from a same material layer among layers formed on the substrate 100 and/or formed at a same time among layers formed in the substrate 100.

The first wiring W3 may include the same material as that of the first gate electrode 213. In an embodiment of manufacturing a display apparatus, for example, the first wiring W3 may be formed on the first gate insulating film 121 by using the same material layer used to form the first gate electrode 213. Accordingly, the first wiring W3 and the first gate electrode 213 include the same material and are located in the same layer among layers disposed on the substrate 100. The first wiring W3 may have a single-layer structure or a multi-layer structure including at least one material from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu).

An electrical resistance per unit length of each of the 2-1 wiring W1 and the 2-2 wiring W2 may be less than an electrical resistance per unit length of the first wiring W3. Accordingly, although lengths of the 2-1 wiring W1 and the 2-2 wiring W2 are greater than a length of the first wiring W3, since a difference between a resistance of each of the 2-1 wiring W1 and the 2-2 wiring W2 and a resistance of the first wiring W3 is reduced, a luminance difference between the main display area DA1 and the edge display areas DA2 is reduced, thereby making it possible for the display area DA to have a uniform luminance.

Figure 5:
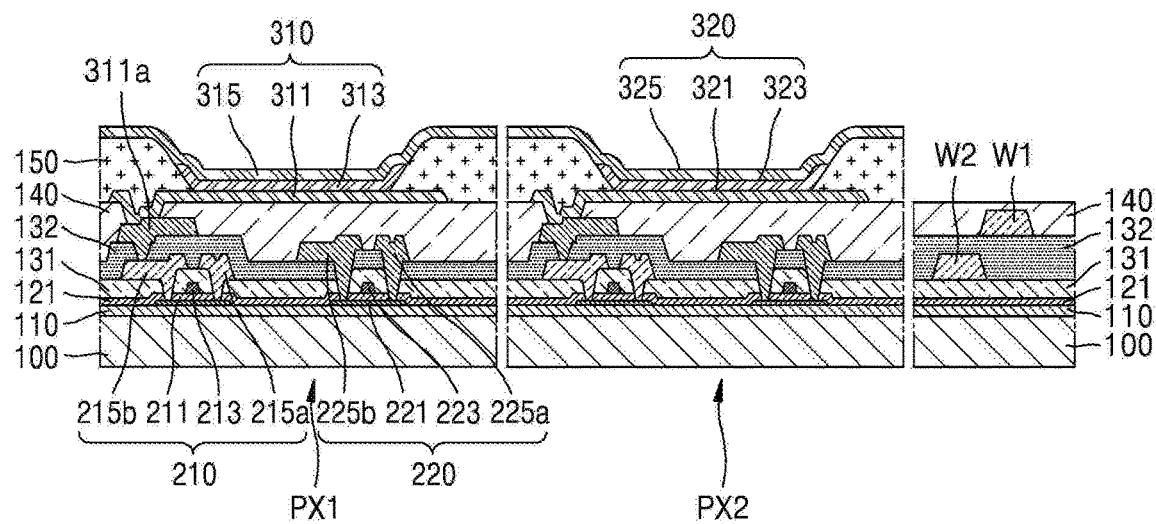
FIG. 5 is a cross-sectional view illustrating another embodiment of portions of FIGS. 2 and 3 according to the invention.

FIG. 5 is a cross-sectional view illustrating another embodiment of portions of FIGS. 2 and 3 according to the invention. As shown in FIG. 5, not only the first TFT 210 but also the second TFT 220 may be included in a same one pixel PX1. In the first TFT 210 and the second TFT 220 included in the pixel PX1, the first source electrode 215a and the first drain electrode 215b of the first TFT 210 may be in one layer among layers disposed on the substrate 100 and the second source electrode 225a and the second drain electrode 225b of the second TFT 220 may be located in a different layer for that of the first source electrode 215a and the first drain electrode 215b. To this end, a second interlayer insulating film 132 that covers the first source electrode 215a and the first drain electrode 215b of the first TFT 210 may be further provided, and the second source electrode 225a and the second drain electrode 225b of the second TFT 220 may be located on the second interlayer insulating film 132. Another pixel PX2 may include TFTs having the same structure as that of the first TFT 210 and the second TFT 220 of the pixel PX1.

Referring to FIG. 5, when any one from among the first source electrode 215a and the first drain electrode 215b of the first TFT 210 is electrically connected to the pixel electrode 311, an intermediate conductive layer 311a may be located between the any one of the first source electrode 215a and the first drain electrode 215b and the pixel electrode 311 connected thereto. That is, the intermediate conductive layer 311a may contact any one from among the first source electrode 215a and the first drain electrode 215b, and the pixel electrode 311 may contact the intermediate conductive layer 311a to be connected to the one from among the first source electrode 215a and the first drain electrode 215b.

The intermediate conductive layer 311a may include the same material as that of the first source electrode 215 and the first drain electrode 215b. In an embodiment of a method of manufacturing a display apparatus, the intermediate conductive layer 311a may be formed from a same material as that of the first source electrode 215 and the first drain electrode 215b. In an embodiment, for example, the intermediate conductive layer 311a may have a three-layer structure formed of titanium/aluminum/titanium.

The intermediate conductive layer 311a, the second source electrode 225a and the second drain electrode 225b of the second TFT 220 may include the same material and may be located in the same layer among layers on the substrate 100. That is, in an embodiment of a method of manufacturing a display apparatus, the intermediate conductive layer 311a may be formed at a time and from a same material layer as that of the second source electrode 225a and the second drain electrode 225b when the second source electrode 225a and the second drain electrode 225b are formed.

Referring to FIG. 5, the 2-1 wiring W1 from among the 2-1 wiring W1 and the 2-2 wiring W2 that are adjacent to each other may include the same material as that of the intermediate conductive layer 311a and may be located on the second interlayer insulating film 132. The 2-2 wiring W2 from among the 2-1 wiring W1 and the 2-2 wiring W2 that are adjacent to each other may include the same material as that of the first source electrode 215a and the first drain electrode 215b of the first TFT 210 and may be located on the first interlayer insulating film 131. That is, the 2-1 wiring W1 and the 2-2 wiring W2 may be located with the second interlayer insulating film 132 therebetween.

In this case, the 2-1 wiring W1 and the 2-2 wiring W2 may be aligned so that an edge of the 2-1 wiring W1 and the 2-2 wiring W2 vertically overlap each other. The edge of the 2-1 wiring W1 refers to an edge closest to the 2-2 wiring W2 which is extended along the length thereof, and the edge of the 2-2 wiring W2 refers to an edge closest to the 2-1 wiring W1 which is extended along the length thereof. Accordingly, when compared to a case where the 2-1 wiring W1 and the 2-2 wiring W2 are formed in the same layer, a horizontal interval (e.g., X-axis direction in FIG. 5) between the 2-1 wiring W1 and the 2-2 wiring W2 may be reduced. Since a plurality of the 2-1 wirings W1 and the 2-2 wirings W2 are located outside the first portion P1 (see FIG. 1), when an interval between the 2-1 wirings W1 and the 2-2 wirings W2 is reduced as described above, the planar area occupied by the 2-1 wirings W1 and the 2-2 wirings W2 at the first portion P1 is reduced, thereby reducing a dead space (e.g., non-display area) outside the first portion P1 (see FIG. 1).

Figure 6:
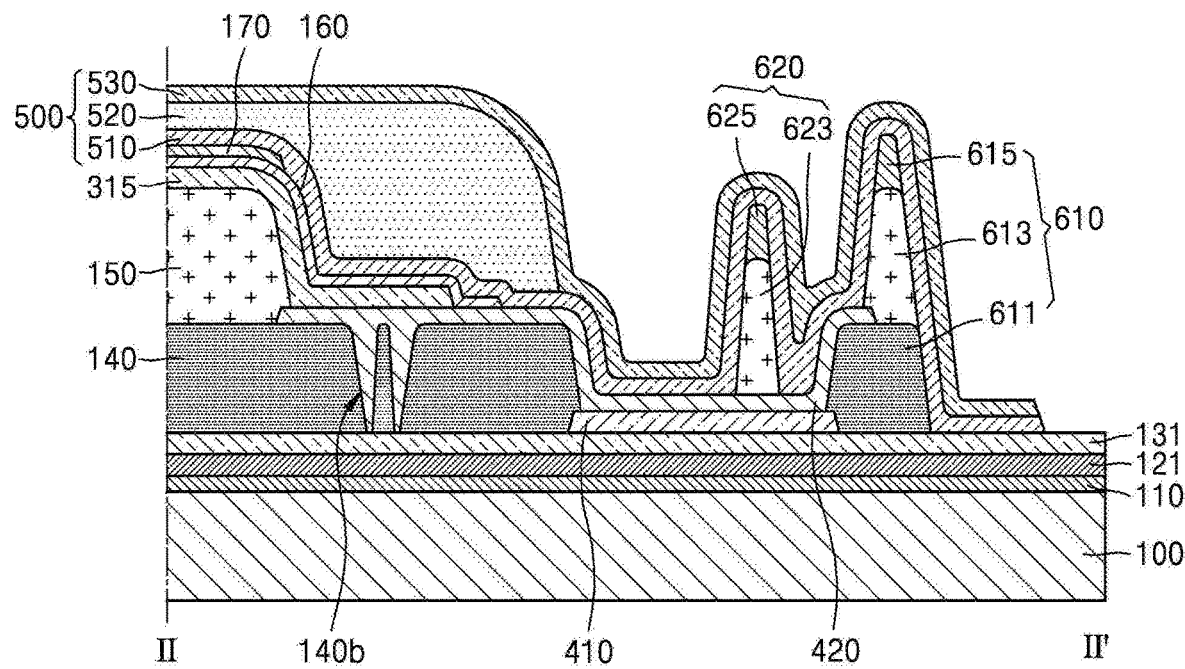
FIG. 6 is a cross-sectional view of an edge portion of the display apparatus taken along line II-II' of FIG. 1 according to the invention.
Figure 7:
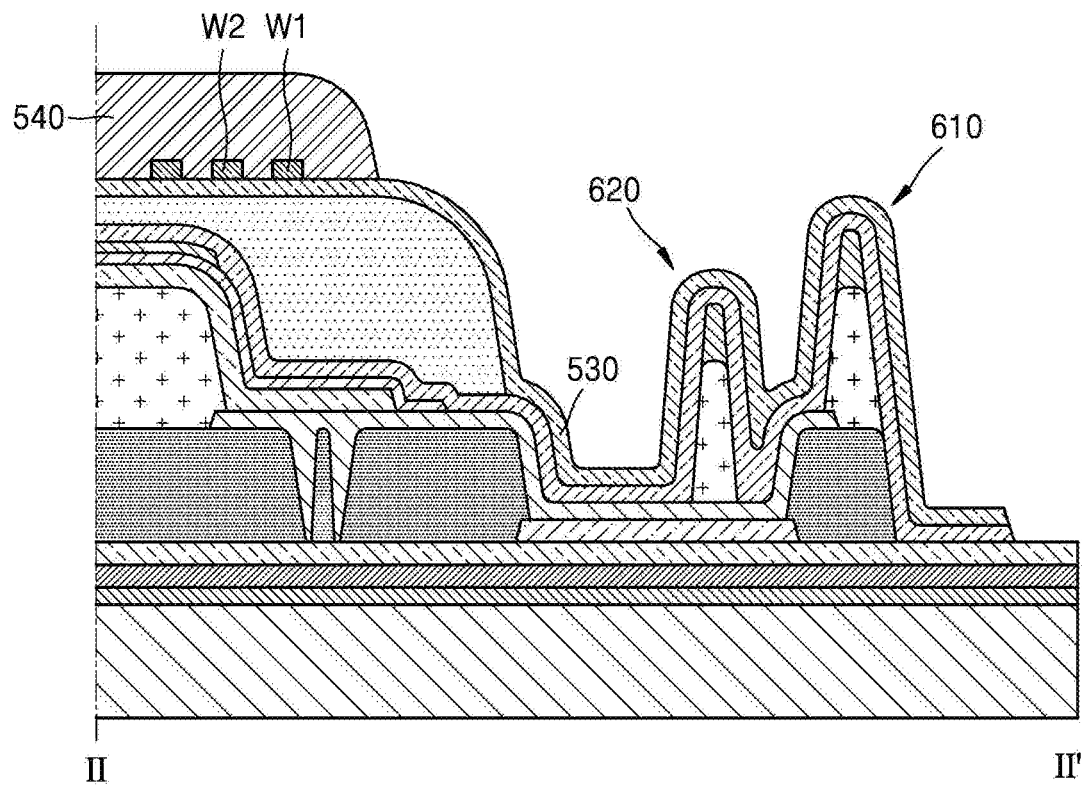
FIG. 7 is a cross-sectional view of another embodiment of the edge portion of the display apparatus taken along line II-II' of FIG. 1 according to the invention.
Figure 8:
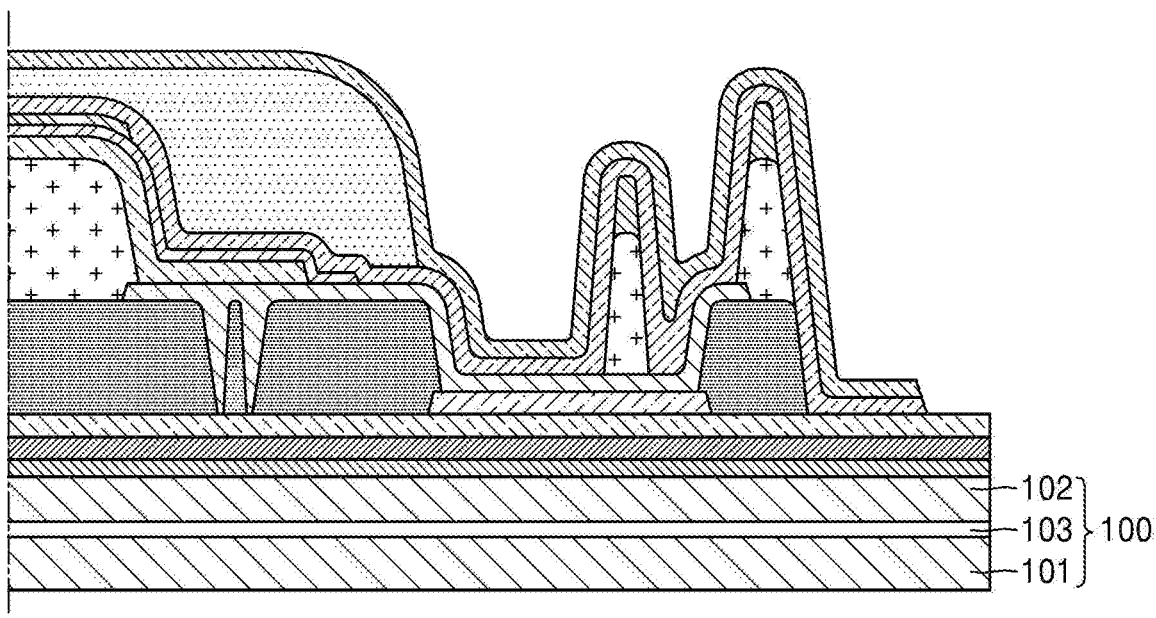
FIG. 8 is a cross-sectional view of still another embodiment of the edge portion of the display apparatus taken along line II-II' of FIG. 1 according to the invention.

FIG. 6 is a cross-sectional view of an edge portion of the display apparatus 10 taken along line II-II' of FIG. 1 according to the invention. FIG. 7 is a cross-sectional view of another embodiment of the edge portion of the display apparatus taken along line II-II' of FIG. 1 according to the invention. FIG. 8 is a cross-sectional view of still another embodiment of the edge portion of display device taken along line II-II' of FIG. 1 according to the invention. Various elements in the display area DA may extend to the peripheral area PA at the edge portion of the display apparatus which is shown in FIGS. 6 to 8.

First, referring to FIG. 6, the display apparatus 10 (see FIG. 1) includes an electrode power supply line 410 electrically connected to the counter electrode 315 in the display area DA, and an encapsulation layer 500 configured to protect an organic light emitting device from external moisture or oxygen by covering the organic light-emitting device.

The electrode power supply line 410 may include or be formed from a same material layer and/or formed at a same time when various conductive layers in the display area DA (see FIG. 1) are formed. In an embodiment, for example, the electrode power supply line 410 may be formed at a time and from a same material layer when the first source electrode 215a (see FIG. 4) and the first drain electrode 215b (see FIG. 4) are formed, and may be located on the first interlayer insulating film 131 (see FIG. 4). However, embodiments are not limited thereto and various modifications may be made, and, for example, the electrode power supply line 410 may be formed on the first gate insulating film 121 (see FIG. 4) from a same material layer when the first gate electrode 213 (see FIG. 4) is formed.

At the edge portion of the display apparatus 10, the electrode power supply line 410 may directly contact the counter electrode 315, or may be electrically connected to the counter electrode 315 through a protective conductive layer 420 as shown in FIG. 6. That is, the protective conductive layer 420 located on the planarization layer 140 and connected to the counter electrode 315 may extend to the electrode power supply line 410 and may be electrically connected to the electrode power supply line 410. In an embodiment, for example, the protective conductive layer 420 may be formed by using the same material layer and/or at a same time when the pixel electrode 311 (see FIG. 4) is formed on the planarization layer 140.

In order to effectively prevent impurities such as external oxygen or moisture from penetrating into the display area DA (see FIG. 1) through the planarization layer 140, the planarization layer 140 may have an opening 140b in the peripheral area PA (see FIG. 1) as shown in FIG. 6. Also, the protective conductive layer 420 may be filled in the opening 140b when the protective conductive layer 420 is formed. Accordingly, impurities penetrating into the planarization layer 140 in the peripheral area PA may be effectively prevented from penetrating into the planarization layer 140 in the display area DA.

The opening 140b of the planarization layer 140 may have any of various shapes. In an embodiment, for example, the planarization layer 140 may have the opening 140b that is located outside the display area DA and continuously extends along a collective edge of the display area DA to surround the display area DA in the top plan view. The planarization layer 140 may have a plurality of the openings 140b that each continuously surround the display area DA in the top plan view.

A capping layer 160 for improving the efficiency of light generated in the organic light-emitting device is located on the counter electrode 315. The capping layer 160 covers the counter electrode 315, and extends beyond the counter electrode 315 so that a terminal end of the capping layer 160 is located on the planarization layer 140 at the edge portion of the display apparatus 10. The capping layer 160 includes an organic material.

The encapsulation layer 500 is located on the capping layer 160. The encapsulation layer 500 protects the organic light-emitting device from external moisture or oxygen. To this end, the encapsulation layer 500 extends not only to the display area DA where the organic light-emitting device is located but also to the peripheral area PA outside the display area DA. The encapsulation layer 500 may have a multi-layer structure as shown in FIG. 6. In detail, the encapsulation layer 500 may include a first inorganic encapsulation layer 510, an organic encapsulation layer 520 and a second inorganic encapsulation layer 530 that are sequentially stacked.

The first inorganic encapsulation layer 510 may cover the capping layer 160, and may include silicon oxide, silicon nitride and/or silicon oxynitride. The first inorganic encapsulation layer 510 may be disposed or formed along a structure located under the first inorganic encapsulation layer 510, such as to have the shape or profile of the underlying structure.

The organic encapsulation layer 520 may cover the first inorganic encapsulation layer 510, and may have a thickness great enough to provide a substantially flat top surface. The organic encapsulation layer 520 may include at least one material selected from polyethylene terephthalate, polyethylene naphthalate, polycarbonate, polyimide, polyethylene sulfonate, polyoxymethylene, polyarylate and hexamethyldisiloxane.

The second inorganic encapsulation layer 530 may cover the organic encapsulation layer 520, and may include silicon oxide, silicon nitride and/or silicon oxynitride. Each of the first inorganic encapsulation layer 510 and the second inorganic encapsulation layer 530 may have a planar area in the top plan view greater than that of the organic encapsulation layer 520, and may contact each other outside the organic encapsulation layer 520. That is, exposure of the organic encapsulation layer 520 to outside thereof is reduced or effectively prevented due to the first inorganic encapsulation layer 510 and the second inorganic encapsulation layer 530 disposed on the organic encapsulation layer 520.

Since the encapsulation layer 500 has a multi-layer structure including the first inorganic encapsulation layer 510, the organic encapsulation layer 520 and the second inorganic encapsulation layer 530, even when cracks occur in the encapsulation layer 500, cracks may not be connected between the first inorganic encapsulation layer 510 and the organic encapsulation layer 520 or between the organic encapsulation layer 520 and the second inorganic encapsulation layer 530. Accordingly, a passage through which external moisture or oxygen penetrates into the display area DA may be effectively prevented or suppressed from being formed.

When the encapsulation layer 500 is formed, structures located under the encapsulation layer 500 may be damaged. In an embodiment of a method of manufacturing a display apparatus, for example, the first inorganic encapsulation layer 510 may be formed by using chemical vapor deposition ("CVD"). When the first inorganic encapsulation layer 510 is formed by using CVD, a layer located right under the first inorganic encapsulation layer 510 may be damaged. Accordingly, when the first inorganic encapsulation layer 510 is directly formed on the capping layer 160 as the layer right under the first inorganic encapsulation layer 510, the capping layer 160 for improving the efficiency of light generated in the organic light-emitting device may be damaged, thereby reducing the light efficiency of a display apparatus. Accordingly, in order to effectively prevent the capping layer 160 from being damaged when the encapsulation layer 500 is formed, a protective layer 170 may be located between the capping layer 160 and the encapsulation layer 500. The protective layer 170 may include LiF.

When the encapsulation layer 500 is formed, especially, when the organic encapsulation layer 520 is formed, it is desirable to form an organic encapsulation material layer for forming the organic encapsulation layer 520 only within a preset area. To this end, a first dam 610 may be located in the peripheral area PA (see FIG. 1) as shown in FIG. 6. The first dam 610 is located in the peripheral area PA to be spaced apart from portions of the planarization layer 140.

The first dam 610 may have a multi-layer structure. In an embodiment, for example, the first dam 610 may have a structure in which a first layer 611, a second layer 613 and a third layer 615 are stacked. The first layer 611 may be formed by using the same material layer and/or at a time when the planarization layer 140 is formed, and the second layer 613 may be formed by using the same material layer and/or at a time when the pixel-defining film 150 is formed.

The third layer 615 may be additionally formed on the second layer 613 by using the same material layer as that of the second layer 613 or by using the same material layer as that of the protective layer 170.

The first dam 610 may support masks used when the intermediate layer 313 (see FIG. 4) or the counter electrode 315 of the organic light-emitting device is formed after forming the dam 610 or when the capping layer 160 or the protective layer 170 is formed in a manufacturing process, and may effectively prevent elements that are previously formed from contacting and being damaged by the masks. Also, the first dam 610 may effectively prevent an organic encapsulation layer forming material layer from moving toward an edge of the substrate 100 when the organic encapsulation layer 520 is formed on the first inorganic encapsulation layer 510. Also, since the first dam 610 is spaced apart from portions of the planarization layer 140, external moisture may be effectively prevented from penetrating into the display area DA through these portions of planarization layer 140 formed of an organic material.

The first inorganic encapsulation layer 510 and the second inorganic encapsulation layer 530 of the encapsulation layer 500 may cover the first dam 610 and may extend beyond the first dam 610 to terminate at the edge of the substrate 100, thereby more effectively preventing penetration of external moisture and oxygen.

A second dam 620 may be further formed inside the first dam 610 with respect to the edge of the substrate 100 outside the first dam 610. The second dam 620 may be located on a portion of the electrode power supply line 410 located on the protective conductive layer 420. The second dam 620 may include a lower layer 623 that may be formed by using the same material layer and/or at a time when the second layer 613 of the first dam 610 is formed, and an upper layer 625 that is located on the lower layer 623, may be formed by using the same material layer and/or at a time when the third layer 615 of the first dam 610 is formed. The second dam 620 may have a height less than that of the first dam 610. A height of the dams may be taken at a respective portion thereof furthest from a common reference, such as from the substrate 100.

FIG. 7 has the same structure as FIG. 6 described above, except for the second wirings W1 and W2, and repeated description of the same structure is omitted for convenience of illustration. FIG. 7 illustrates an example where positions of the second wirings W1 and W2 are different from those in FIGS. 4 and 5.

As shown in FIG. 7, the 2-1 wiring W1 and the 2-2 wiring W2 may be located on the second inorganic encapsulation layer 530, and may be connected to a data line disposed in the display area DA via a contact hole or a bridge electrode. When the 2-1 wiring W1 and the 2-2 wiring W2 are located on the second inorganic encapsulation layer 530, the 2-1 wiring W1 and the 2-2 wiring W2 may be covered by a protective film 540. That is, the protective film 540 may be formed on the second inorganic encapsulation layer 530. The protective film 540 may be formed of an organic material.

Although the 2-1 wiring W1 and the 2-2 wiring W2 are located on the second inorganic encapsulation layer 530 in FIG. 7, embodiments are not limited thereto and the 2-1 wiring W1 and the 2-2 wiring W2 may be formed at any of various other positions. In an embodiment, for example, the 2-1 wiring W1 and the 2-2 wiring W2 may be located on the protective film 540. Optionally, the 2-1 wiring W1 and the 2-2 wiring W2 may be located on the second inorganic encapsulation layer 530 to overlap the first dam 610 or the second dam 620. Alternatively, the 2-1 wiring W1 and the 2-2 wiring W2 may be located on the second inorganic encapsulation layer 530 outside the first dam 610 and closer to the edge of the substrate 100 than the first dam 610.

FIG. 8 has the same structure as FIG. 6 described above, except for the substrate and the second wirings relative thereto, and repeated description of the same structure is omitted for convenience of illustration. FIG. 8 is a cross-sectional view for explaining an embodiment where the 2-1 wiring W1 and the 2-2 wiring W2 may be located at various positions relative to a structure of the substrate 100.

Referring to FIG. 8, the substrate 100 may collectively include a first substrate 101, a second substrate 102, and an inorganic layer 103 located between the first substrate 101 and the second substrate 102. The first substrate 101 and the second substrate 102 may each include the same material as that of the substrate 100 (see FIG. 4), and may have the same thickness or different thicknesses from each other and/or from the substrate 100 in FIG. 4. In an embodiment, for example, each of the first substrate 101 and the second substrate 102 may include polyimide and may have a thickness ranging from about 3 micrometers (μm) to about 20 μm.

The inorganic layer 103 that is a barrier layer for preventing penetration of external impurities may have a single-layer structure or a multi-layer structure including an inorganic material such as silicon nitride (SiNx) and/or silicon oxide (SiOx). The inorganic layer 103 may have a thickness of, but not limited to, about 6000 angstroms (Å).

Although not shown in FIG. 8, one of the 2-1 wiring W1 (see FIG. 4) and the 2-2 wiring W2 (see FIG. 4) may be located between the first substrate 101 and the inorganic layer 103, and the other of the 2-1 wiring W1 and the 2-2 wiring W2 may be located between the inorganic layer 103 and the second substrate 102. Alternatively, the 2-1 wiring W1 and the 2-2 wiring W2 may both between the first substrate 101 and the inorganic layer 103 or both between the inorganic layer 103 and the second substrate 102. That is, the 2-1 wiring W1 and the 2-2 wiring W2 may be located in the same layer among layers within the substrate 100 or may be located in different layers among layers within the substrate 100.

Also, the 2-1 wiring W1 and the 2-2 wiring W2 may be located between a plurality of inorganic layers stacked on the second substrate 102. The plurality of inorganic layers may include the buffer layer 110 (see FIG. 4), the first gate insulating film 121 (see FIG. 4) and the first interlayer insulating film 131 (see FIG. 4). That is, the 2-1 wiring W1 and the 2-2 wiring W2 may be located at any arbitrary position between the plurality of inorganic layers stacked on the first substrate 101 and the second substrate 102.

Figure 9:
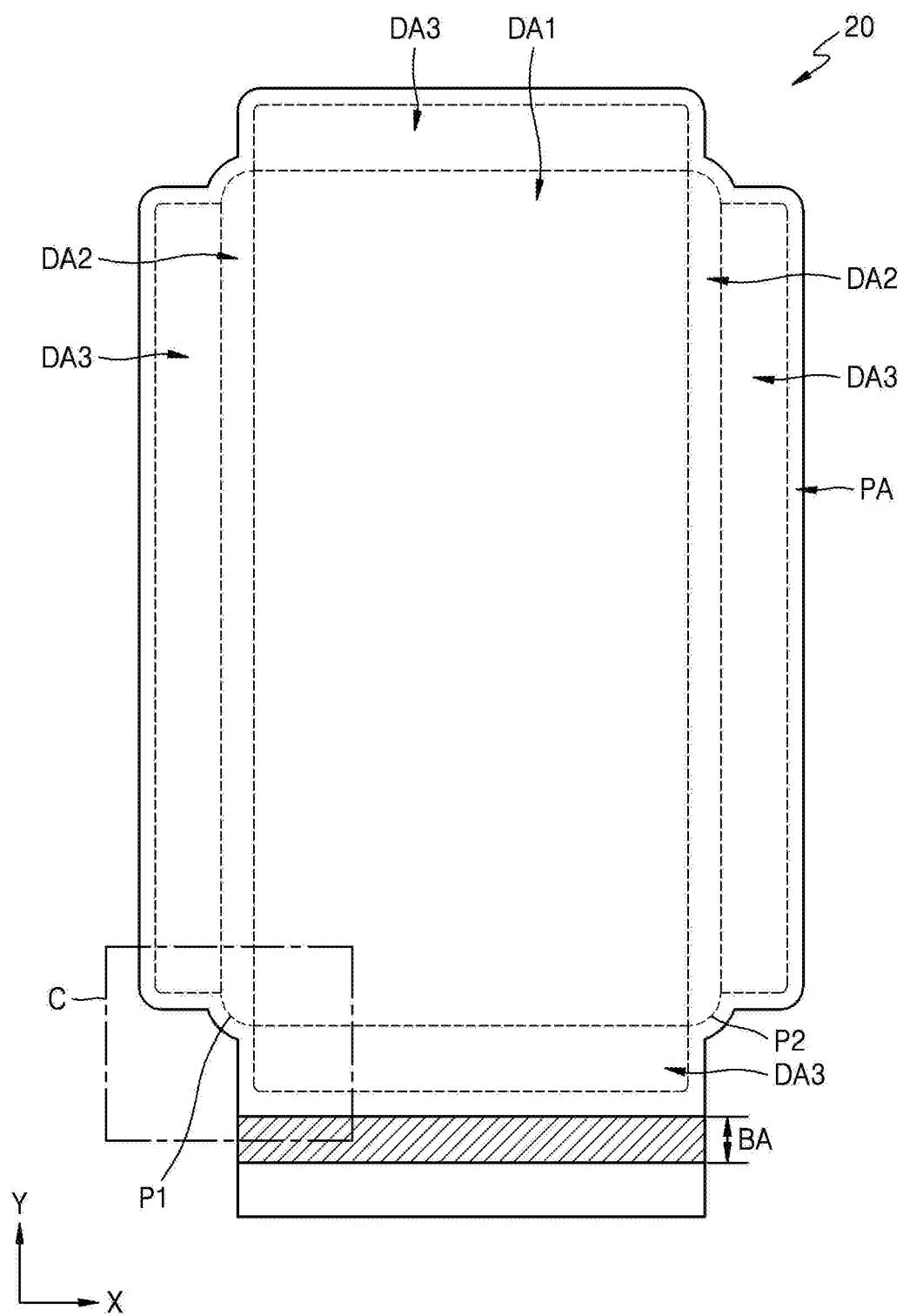
FIG. 9 is a plan view of yet another embodiment of the display apparatus according to the invention.
Figure 10:
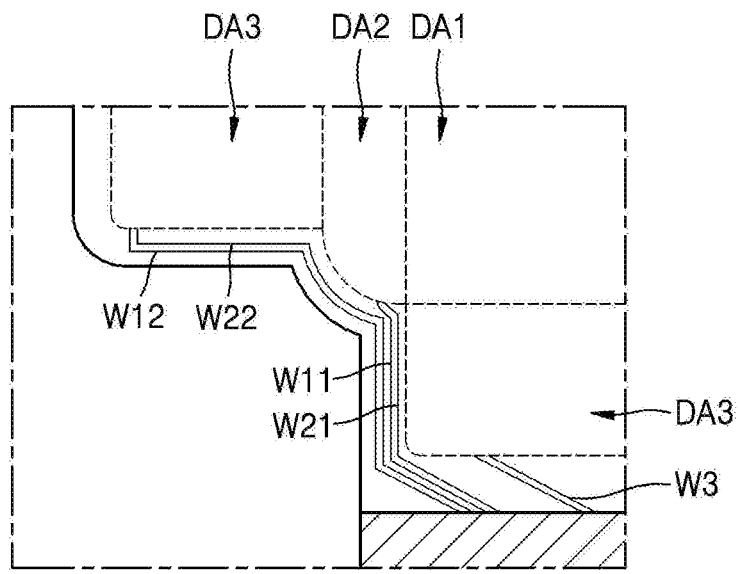
FIG. 10 is an enlarged top plan view illustrating portion C of FIG. 9.
Figure 11:
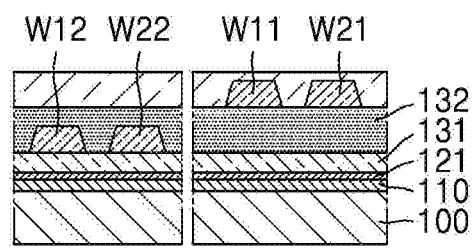
FIG. 11 is a cross-sectional view illustrating an embodiment of portions of FIG. 10 according to the invention.
Figure 12:
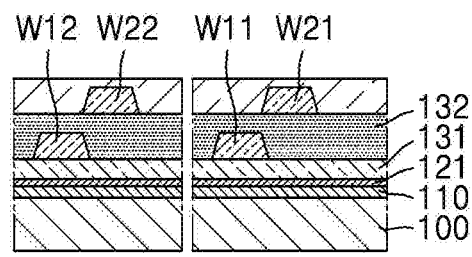
FIG. 12 is a cross-sectional view illustrating another embodiment of portions of FIG. 10 according to the invention.

FIG. 9 is a top plan view of another embodiment of a display apparatus 20 according to the invention. FIG. 10 is an enlarged top plan view illustrating portion C of FIG. 9. FIG. 11 is a cross-sectional view illustrating an embodiment of portions of FIG. 10 according to the invention. FIG. 12 is a cross-sectional view illustrating another embodiment of portions of FIG. 10 according to the invention.

The display apparatus 20 of FIG. 9 includes display areas and the peripheral area PA located outside the display areas. The display areas may include the main display area DA1, the edge display areas DA2 respectively located at opposing sides of the main display area DA1 along the X-axis direction, and at least one side display area DA3. In an un-bent state, the display apparatus 20 includes the main display area DA1, the edge display area DA2 and the side display area DA3 each disposed in a single plane which is parallel to a plane defined in the first (X-axis) and second (Y-axis) directions. That is, the display apparatus 20 of FIG. 9 may be formed by extending the at least one side display area DA3 from the display area DA of the display apparatus 10 of FIG. 1 in a first direction (e.g., an X-axis direction) and/or a second direction (e.g., a Y-axis direction). Accordingly, in the final display apparatus 20 or an electronic apparatus such as a smartphone including the display apparatus 20, the substrate 100 and layers thereon at the edge display areas DA2 may be convexly bent outward at both of the opposing sides of the main display area DA1, and the first portion P1 and the second portion P2 of an edge may have round shapes.

When the at least one side display area DA3 extends from the edge display area DA2 in the first direction (e.g., the X-axis direction), the at least side display area DA3 may be continuously formed with the edge display area DA2. Also, when the at least one side display area DA3 extends from the edge display area DA2 in the second direction (e.g., the Y-axis direction), the at least side display area DA3 may be continuously formed with the main display area DA1.

The side display area DA3 that is substantially perpendicularly bent from the main display area DA1 to be disposed in a different plane than that of the main display area DA1 is located at a side surface of the display apparatus 20 or an electronic apparatus such as a smartphone including the display apparatus 20. Where an edge display area DA2 is disposed between the main display area DA1 and the side display area DA3 disposed perpendicular thereto, the edge display area DA2 is inclined with respect to the display areas DA1 and DA3 to connect these display areas to each other. Elements of the side display area DA3 may be electrically connected to elements of the edge display area DA2 or elements of the main display area DA1. In an embodiment, for example, although the display apparatus 20 includes four side display areas DA3 in FIG. 9, when the electronic apparatus such as the smartphone has a hexahedral shape, display is possible on five surfaces except a bottom surface.

The bending area BA is located outside any one side display area DA3, and is set so that a pad area is located behind the main display area DA1 in the final display apparatus 20 or an electronic apparatus such as a smartphone including the display apparatus 20 with bend layers thereof. The peripheral area PA may include a bending area BA at which components of the display apparatus 20 such as the substrate 100 and layers thereon are bendable. In the top plan view, the bending area BA may be located between the pad area (see PADA in FIGS. 1 and 2) and the display area DA.

FIG. 10 is an enlarged top plan view illustrating the portion C of FIG. 9, especially illustrating wirings (e.g., W11, W21, W12, W22, and W3) through which an electrical signal such as a data signal is applied to the edge display areas DA2 and the side display areas DA3.

For convenience of explanation, the following will be described on the assumption that a wiring for applying a data signal to the main display area DA1 is referred to as a first wiring W3, wirings for applying a data signal to the edge display areas DA2 are referred to as second wirings 2-1 wiring W11 and a 2-2 wiring W21, and wirings W12 and W22 for applying a data signal to the side display areas DA3 that are continuously formed with the edge display areas DA2 are referred to as third wirings 3-1 wiring W12 and a 3-2 wiring W22. A data signal applied to the main display area DA1 may be applied to the main display area DA1 through the side display area DA3 that is continuously formed with the main display area DA1 (e.g., at upper and lower ends of the top plan view in FIG. 9).

As shown in FIG. 10, lengths of the 2-1 wiring W11 and the 2-2 wiring W21 are greater than a length of the first wiring W3, and lengths of the 3-1 wiring W12 and the 3-2 wiring W22 are greater than lengths of the 2-1 wiring W11 and the 2-2 wiring W21. The lengths may be the largest dimension of a wiring in the top plan view thereof. Accordingly, an electrical resistance per unit length of each of at least the 2-1 wiring W11 through 3-2 wiring W22 should be less than a resistance per unit length of the first wiring W3.

In an embodiment, for example, as shown in FIG. 11, the 2-1 wiring W11 and the 2-2 wiring W21 may include the same material as that of the intermediate conductive layer 311a (see FIG. 5), and the 3-1 wiring W12 and the 3-2 wiring W22 may include the same material as that of the first source electrode 215a (see FIG. 5) and the first drain electrode 215b (see FIG. 5). In this case, the first wiring W3 may include the same material as that of the first gate electrode 213 (see FIG. 5).

Alternatively, as shown in FIG. 12, the 2-1 wiring W11 for applying a data signal to the edge display area DA2 and the 3-1 wiring W12 for applying a data signal to the side display area DA3 that is continuously formed with the edge display area DA2 may include the same material as that of the first source electrode 215a and the first drain electrode 215b, and the 2-2 wiring W21 and the 3-2 wiring W22 may include the same material as that of the intermediate conductive layer 311a.

That is, as shown in FIG. 12, the 2-1 wiring W11 and the 2-2 wiring W21 may be located with the second interlayer insulating film 132 (see FIG. 5) therebetween, and in this case, edges of the 2-1 wiring W11 and the 2-2 wiring W21 may be vertically aligned. Likewise, edges of the 3-1 wiring W12 and the 3-2 wiring W22 may be vertically aligned with the second interlayer insulating film 132 (see FIG. 5) between the wirings. In addition, the 2-1 wiring W11 and the 3-2 wiring W22, or the 2-2 wiring W21 and the 3-1 wiring W12 may vertically overlap each other. Accordingly, the planar area occupied by the 2-1 wiring W11 through the 3-2 wiring W22 outside the first portion P1 and the second portion P2 of the edge of the edge display area DA2 may be reduced owing to the overlapping edges thereof, thereby reducing a dead space outside the first portion P1 and the second portion P2.

Positions of the 2-1 wiring W11 through the 3-2 wiring W22 are not limited to those in FIGS. 11 and 12, and may be any of various other positions as described with reference to FIGS. 6 and 7.

According to one or more embodiments, since an electrical resistance per unit length of a wiring for applying a signal to a main display area is greater than an electrical resistance per unit length of a wiring for applying a signal to an edge display area, an overall display area of a display apparatus may have a uniform luminance. However, the scope of the present disclosure is not limited by the effect.

While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
  a substrate comprising:
    a display area, the display area comprising a main display area and an edge display area which is extended from a side of the main display area, and
    a peripheral area which is outside the display area, the peripheral area comprising a pad area through which data signals are applied to the display area; and
  in the peripheral area, a plurality of wirings between the display area and the pad area and through which the data signals are transmitted from the pad area to the display area, the plurality of wirings comprising:
    a first wiring through which a first data signal is transmitted from the pad area to the main display area, the first wiring including a material having an electrical resistance, and
    a second wiring through which a second data signal is transmitted from the pad area to the edge display area, the second wiring including a material having an electrical resistance,
    wherein the electrical resistance of the material of the first wiring is greater than the electrical resistance of the material of the second wiring.

2. The display apparatus of claim 1, further comprising:
  a thin-film transistor in the display area and comprising a gate electrode, a source electrode and a drain electrode, and
  a first interlayer insulating film respectively between the gate electrode and each of the source and drain electrodes,
  wherein
  the second wiring comprises a same material as the source electrode and the drain electrode, and
  the first wiring comprises a same material as the gate electrode.

3. The display apparatus of claim 2, wherein the second wiring, the source electrode and the drain electrode are in a same layer as each other among layers disposed on the substrate.

4. The display apparatus of claim 2, further comprising:
  a second interlayer insulating layer covering the source electrode and the drain electrode; and
  an intermediate conductive layer connected to the source electrode or the drain electrode, the second interlayer insulating layer disposed between the intermediate conductive layer and the respective source electrode or drain electrode connected thereto.

5. The display apparatus of claim 4, wherein
  in the peripheral area, the second wiring is provided in plural between the display area and the pad area to be adjacent to each other in a direction along the substrate,
  one of two adjacent second wirings in the peripheral area is in a same layer as the source electrode and the drain electrode of the display area among layers disposed on the substrate, and
  the remaining one of the two adjacent second wirings in the peripheral area is in a same layer as the intermediate conductive layer in the display area.

6. The display apparatus of claim 5, wherein
  in the direction along the substrate, adjacent side surfaces of the two adjacent second wirings in the peripheral area are closest to each other, and
  in a cross-sectional direction, the adjacent side surfaces are aligned with each other.

7. The display apparatus of claim 1, wherein
  the display area further comprises a side display area disposed in a plane perpendicular to a plane in which the main display area is disposed, and
  the side display area is extended directly from the edge display area or extended directly from the main display area.

8. The display apparatus of claim 7, wherein
the side display area is extended directly from the edge display area,
the plurality of wirings further comprise a third wiring through which a third data signal is transmitted from the pad area to the side display area, the third wiring including a material having an electrical resistance, and
the electrical resistance of the material of the third wiring is less than the electrical resistance of the material of the first wiring.

9. The display apparatus of claim 1, further comprising:
a thin-film transistor in the display area;
a display device which is electrically connected to the thin-film transistor and emits light to display the image; and
an encapsulation layer which seals the display device on the substrate,
wherein
the encapsulation layer comprises a first inorganic encapsulation layer, an organic encapsulation layer and a second inorganic encapsulation layer sequentially stacked, and
in the peripheral area, the second wiring is on the second inorganic encapsulation layer.

10. The display apparatus of claim 1, wherein
the substrate comprises a first substrate layer, a second substrate layer, and an inorganic layer located between the first substrate layer and the second substrate layer, and
the second wiring is between the first substrate layer and the inorganic layer, between the inorganic layer and the second substrate layer, or both between the first substrate layer and the inorganic layer and between the inorganic layer and the second substrate layer.

11. A display apparatus comprising:
a substrate comprising:
a display area, the display area comprising:
a main display area,
an edge display area which is extended from the main display area, the edge display area being convexly curved relative to the main display area, and
a side display area disposed in a plane substantially perpendicular to a plane in which the main display area is disposed, and
a peripheral area outside the display area, the peripheral area comprising: a pad area through which electrical signals are applied to the display area; and
in the peripheral area, a plurality of wirings between the display area and the pad area and through which the electrical signals are transmitted from the pad area to the display area, the plurality of wirings comprising:
a first wiring through which an electrical signal is transmitted from the pad area to the main display area,
second wirings through which an electrical signal is respectively transmitted from the pad area to the edge display area, and
a third wiring through which an electrical signal is transmitted from the pad area to the side display area,
wherein an electrical resistance per unit length of each of the second wirings and an electrical resistance per unit length of the third wiring are less than an electrical resistance per unit length of the first wiring.

12. The display apparatus of claim 11, wherein the side display area is extended directly from the edge display area.

13. The display apparatus of claim 11, wherein
the side display area is provided in plurality comprising:
a first side display area extended directly from the edge display area, and
a second side display area extended directly from the main display area,
wherein the first wiring transmits the electrical signal to the main display area through the second side display area extended directly from the main display area.

14. The display apparatus of claim 11, further comprising:
a thin-film transistor in the display area and comprising a gate electrode, and a source electrode and a drain electrode,
a first interlayer insulating film respectively between the gate electrode and each of the source and drain electrodes;
a second interlayer insulating layer covering the source electrode and the drain electrode; and
an intermediate conductive layer located connected to the source electrode or the drain electrode, the second interlayer insulating layer disposed between the intermediate conductive layer and the respective source electrode or drain electrode connected thereto,
wherein the second wirings and the third wiring in the peripheral area comprise a same material as the intermediate conductive layer or the source electrode and the drain electrode in the display area.

15. The display apparatus of claim 14, wherein
any one of two adjacent wirings from among the second wirings in the peripheral area is in a same layer as the source electrode and the drain electrode in the display area among layers disposed on the substrate, and
the remaining one of the two adjacent wirings in the peripheral area is in a same layer as the intermediate conductive layer in the display area among the layers disposed on the substrate.

16. The display apparatus of claim 15, wherein
in the peripheral area, the third wiring is provided in plural between the display area and the pad area to be adjacent to each other in a top plan view,
one of two adjacent third wirings in the peripheral area is in a same layer as the source electrode and the drain electrode in the display area among layers disposed on the substrate, and
the remaining one of the two adjacent third wirings in the peripheral area is in a same layer as the intermediate conductive layer in the display area among the layers disposed on the substrate.

17. The display apparatus of claim 16, wherein the second wiring located in the same layer as the intermediate conductive layer and the third wiring located in the same layer as the source electrode and the drain electrode overlap each other.

18. The display apparatus of claim 11, wherein
the substrate comprises a first substrate layer, a second substrate layer, and an inorganic layer located between the first substrate layer and the second substrate layer, and
the second wirings and the third wiring are between the first substrate layer and the inorganic layer, between the inorganic layer and the second substrate layer, or both between the first substrate layer and the inorganic layer and between the inorganic layer and the second substrate layer.

19. The display apparatus of claim 11, further comprising:
a thin-film transistor in the display area;

a display device which is electrically connected to the thin-film transistor and emits light to display the image; and an encapsulation layer which seals the display device on the substrate, wherein the encapsulation layer comprises a first inorganic encapsulation layer, an organic encapsulation layer, and a second inorganic encapsulation layer sequentially stacked, and in the peripheral area, the second wirings and the third wiring are on the second inorganic encapsulation layer.

20. The display apparatus of claim 19, further comprising in the peripheral area, a protective film covering the second wirings and the third wiring which are on the second inorganic encapsulation layer.

* * * * *